United States Patent [19]

Chang

[11] 4,028,672
[45] June 7, 1977

[54] REWRITABLE BUBBLE DOMAIN DECODER

[75] Inventor: Hsu Chang, Yorktown Heights, N.Y.

[73] Assignee: International Business Machines Corporation, Armonk, N.Y.

[22] Filed: Mar. 24, 1976

[21] Appl. No.: 669,778

Related U.S. Application Data

[63] Continuation of Ser. No. 429,411, Dec. 28, 1973, abandoned.

[52] U.S. Cl. .................................... 340/174 TF
[51] Int. Cl.² .................................... G11C 11/14
[58] Field of Search .......................... 340/174 TF

[56] References Cited

UNITED STATES PATENTS

| | | | |
|---|---|---|---|
| 3,753,253 | 8/1973 | Smith | 340/174 TF |
| 3,760,386 | 9/1973 | Quadri | 340/174 TF |

OTHER PUBLICATIONS

IBM Technical Disclosure Bulletin — vol. 14, No. 6, Nov. 1971, pp. 1915–1916.
IBM Technical Disclosure Bulletin — vol. 15, No. 6, Nov. 1972, pp. 2027–2029.

*Primary Examiner*—James W. Moffitt
*Attorney, Agent, or Firm*—Jackson E. Stanland

[57] ABSTRACT

A rewritable bubble domain decoder employing a novel switch which is used to determine the path of magnetic bubble domains in a magnetic medium. In contrast to other decoders which are defined and unalterable by their structures, the present decoder has a universal structure, but is amenable to personalization and re-writing by re-loading personalizing (or control) bubbles. A basic element in the decoder is a switch which is characterized by its ability to have its normal function altered in addition to being able to switch between two states. That is, it is a switch in which the normal path direction for bubble domain movement can be changed at any time. In a preferred embodiment, the switch is comprised of a structure for holding a bubble domain which is used to route other bubble domains, together with a structure for overcoming the effect of the routing bubble domain on the input bubble domains to the switch. Thus, a routing bubble domain placed at a articular location remains there throughout the operation of the circuitry rather than having to be removed every time a change in the state of the switch is required. The state of the switch is changed by a superposed and over-powering current. On the other hand, the positions of switches in the decoder can be relocated (hence re-writability) by re-loading the control domains.

14 Claims, 10 Drawing Figures

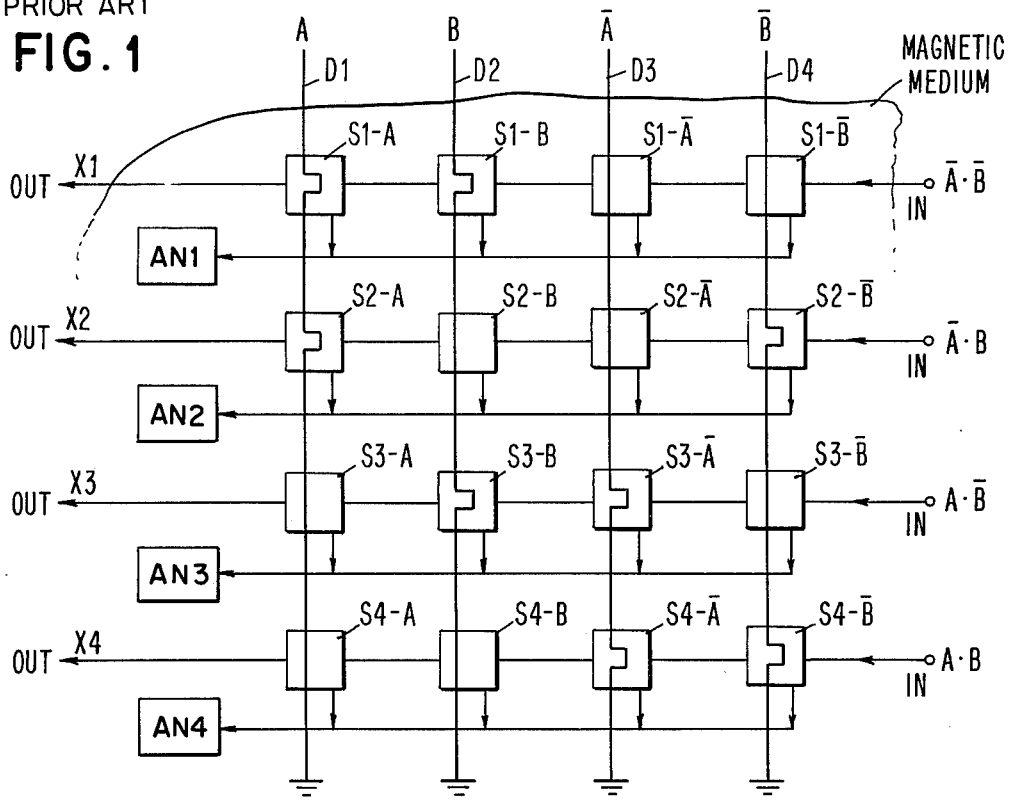
PRIOR ART
FIG. 1
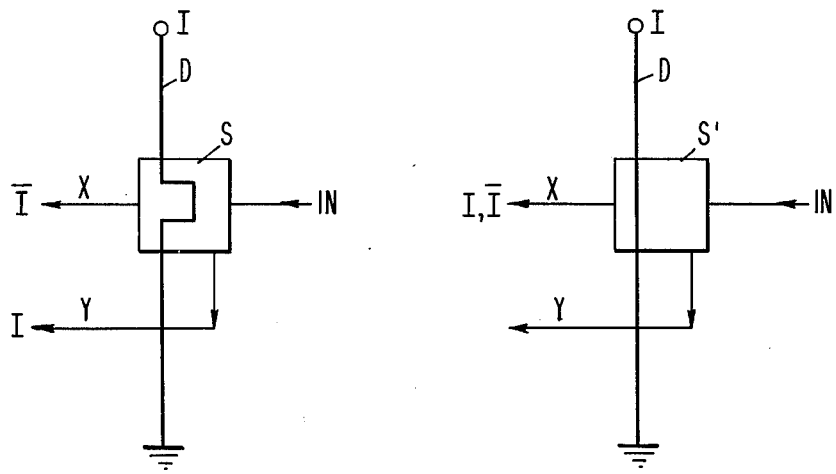
FIG. 2A
PRIOR ART
FIG. 2B
PRIOR ART

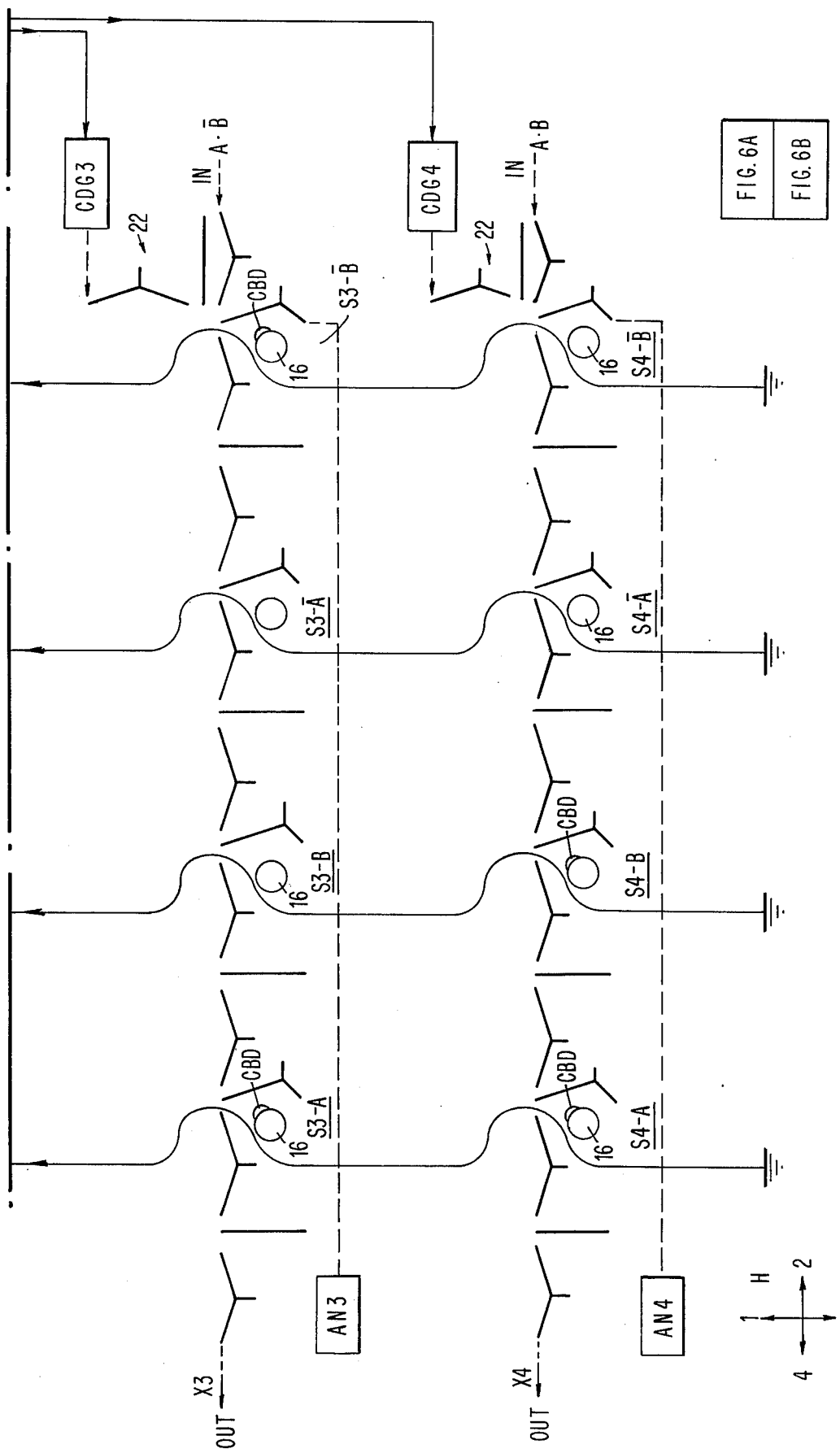

REWRITABLE BUBBLE DOMAIN DECODER

This is a continuation of application Ser. No. 429,411 filed Dec. 28, 1973 now abandoned.

CROSS-REFERENCE TO RELATED APPLICATIONS

Ser. No. 429,415, filed Dec. 28, 1973 now abandoned, describes a technique for improving the yield of a magnetic bubble domain chip, and in particular shows a novel switch element for implementing a redundancy technique. That bubble-loadable switch element has aspects of similarity to the preferred structures (but not modes of operation) of switches for re-writable switches described herein.

BACKGROUND OF THE INVENTION

1. Field of the Invention

This invention relates to re-writable bubble-domain decoders and more particularly to such decoders utilizing switches which are controlled by both current and a pre-loaded domain. The ability to preload domains into specified switch positions allows re-writability.

2. Description of the Prior Art

Decoders for magnetic bubble domain systems are known in the art as can be seen by referring to U.S. Pat. Nos. 3,689,902; 3,701,125; 3,757,314. These decoders are characterized in that a plurality ($2^N$) of storage positions, (e.g., shift registers) or logic positions are accessed using a cascade of switches so that only a minimum number (N or 2N) of interconnections and circuits are needed. Preferred directions of bubble domain movement is determined in accordance with the currents applied on a plurality of current carrying control loops which are adjacent to the bubble propagation paths. Consequently, once these current carrying control loops are provided, addressing is achieved in accordance with the current signals produced thereon. These decoders are not re-writable, since the decoder addresses can be changed only by removing and replacing the current-control-loop switches.

U.S. Pat. Nos. 3,753,253 and 3,760,386 describe bubble domain systems in which interactions between magnetic bubble domains are used to provide desired paths of movement of bubble domains. For instance, U.S. Pat. No. 3,753,253 shows the provision of trapped domains at the intersection of propagation paths. The presence of a domain at an intersection causes subsequent domains to take a particular path. If no domain is trapped at the intersection, then subsequent domains will take a second path. Here, the preferred direction of movement through the intersection is determined by the presence and absence of a domain trapped therein. In order to change the direction, the trapped domain must be removed from the intersection or placed there. It is not possible to place a domain permanently at an intersection and yet have the switch at that intersection be able to effect selection between two states to provide a selected output path for subsequent domains.

U.S. Pat. No. 3,760,386 is similar to U.S. Pat. No. 3,753,253 in that the control domain, which is used to provide bubble domain interactions to determine a desired output path, is either present or absent depending upon the output path desired. It is not possible to provide a plurality of output paths if the control domain always remains trapped at the intersection.

The prior art which relies upon placing and removing a control domain at an intersection of propagation paths involves additional hardware and timing circuitry. Generally, it is less efficient to have to constantly insert control domains and remove control domains in order to change the preferred path of subsequent domains through a switch. More timing is involved for this operation, additional delays are introduced, and additional power requirements are present.

Accordingly, it is a primary object of this invention to provide a switch with its position defined by the loading of a control domain, but with its switch action provided by an activating current.

It is an additional important object of this invention to provide a rewritable bubble domain decoder which has a universal structure but is personalizable as well as rewritable.

It is another object of the present invention to provide a rewritable bubble domain circuit which does not require extensive timing circuits or excessive power to achieve the circuit function.

It is a further object of this invention to provide a rewritable circuit whose addresses for bubble domain propagation can be readily changed with a minimum number of interconnections to the magnetic chip in which the bubble domains exist.

It is a still further object of this invention to provide redundancy in a magnetic chip in order to improve the yield of such chips, using a technique which is simple, consumes low power, and requires a minimum of circuitry.

It is also an object of this invention to provide hardware and a method of operation for applications where alterable and re-positionable switches are needed.

BRIEF SUMMARY OF THE INVENTION

This rewritable bubble domain decoder employs a plurality of switches for determining the path of bubble domains in a magnetic medium. These switches can exist in at least two stable states and are characterized in that the preferred state is switchable depending upon operation of the switch. That is, the path normally taken by bubble domains through the switch can be changed at any time. In this manner, new addresses can be created for the various propagation paths for bubble domains through the decoder.

In a preferred embodiment, each switch comprises a structure for holding a control bubble domain which is then used to determine the path direction of subsequent bubble domains. However, additional structure is provided for overcoming the effect of the control bubble domains. Consequently, a switch with a control bubble domain can be made to act the same as a switch having no control bubble domain. These switches have a universal structure which can be personalized and rewritten by re-loading the personalizing, or control bubbles.

In the preferred embodiment, current carrying decode conductors are used to control the preferred path of domains through the switch whether or not control bubble domains are present in the switch. The same structure can be utilized for every switch leading to ease of manufacture. In addition, the various switch states can be established and no power beyond that required in the decode conductors is required.

These and other objects, features, and advantages will be more apparent from the following more particular description of the preferred embodiment.

BRIEF DESCRIPTION OF THE DRAWINGS

FIG. 1 is a schematic diagram of a decoder circuit for magnetic bubble domains, as is known in the prior art.

FIGS. 2A and 2B illustrate the movement of bubble domains through the two types of switches employed in the decoder of FIG. 1.

FIG. 6 is a schematic diagram showing how FIGS. 6A and 6B are oriented with respect to one another.

FIGS. 6A and 6B comprise a detailed circuit diagram for the decoder circuitry illustrated in FIG. 3.

DETAILED DESCRIPTION OF THE PREFERRED EMBODIMENTS

GENERALIZED DECODER DESCRIPTION

Figure 3:
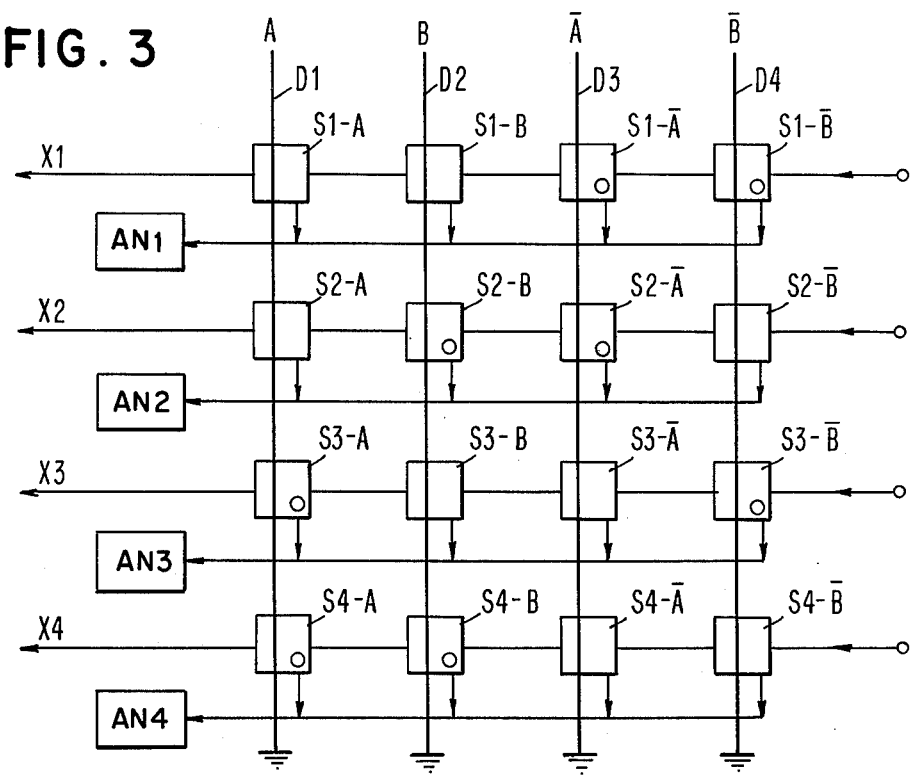
FIG. 3 is a schematic representation of a bubble domain decoder in accordance with the present invention.

Since bubble domain decoders are described clearly in aforementioned U.S. Pat. Nos. 3,701,125 and 3,689,902, the following will be introductory remarks relating in general to these types of decoders. Accordingly, FIG. 1 is a schematic illustration of a bubble domain decoder in which only one path out of a plurality of paths is selected in accordance with control signals applied to overlying conductors.

In more detail, there are four propagation paths illustrated for movement of magnetic bubble domains in the magnetic medium from right to left in this decoder. These propagation paths are designated X1, X2, X3, and X4. Depending upon the decode currents present on the decode conductors D1, D2, D3, and D4, one of the horizontal paths X1–X4 will be traversed for bubble domains from the input to the output of that path. For instance, if currents $\overline{A}$ and $\overline{B}$ are present on conductors D3 and D4, while no currents exist on conductors D1 and D2, then domains appearing at the X1 propagation input will propagate to the left to the output of that propagation path. Domains appearing at the inputs to the other propagation paths will not reach the outputs of those propagation paths but instead will be sent to annihilators, or to other parts of the magnetic chip in which they move.

The decoder conductors D1–D4 provide current control for switches located along each bubble domain propagation path. For instance, switches S1-A, S1-B, S1-$\overline{A}$, and S1-$\overline{B}$ are located along propagation path X1. Depending upon the currents present in the decode conductors D1–D4, bubble domains appearing at the input of path X1 will either get to the output of that path or be rerouted to an annihilator AN1. Of course, bubble domains which are not sent to the output of path X1 can be sent to other circuits, rather than being sent to annihilator AN1.

The currents which are required in the decode lines D1–D4 in order to select any one propagation path for movement of bubble domains are shown on the right-hand portion of FIG. 1. For instance, currents A and $\overline{B}$ present in conductors D1 and D4 will allow bubble domains to propagate to the output along path X3, but will block passage of domains along the other propagation paths.

FIGS. 2A and 2B illustrate the operation of the two types of switch junctions in FIG. 1. For instance, the switch in FIG. 2A is designated S, while the current control line is designated D. Bubble domains appearing at the input of this switch will leave the switch by either path X or path Y depending upon whether or not a current I exists in decode line D. For this switch, if current I is present in line D, domains will exit along path Y, while if current is not present in line D, domain will exit along path X.

Referring to FIG. 2B, a decode line D is used as a straight through conductor, and the domain path is straight through the junction. Thus, the two structures of FIGS. 2A and 2B can be compared as follows:

|  | FIG. 2A | FIG. 2B |
|---|---|---|
| Conductor | Has personalization, due to looping of conductor D for switching. | No personalization straight through conductor used. |
| Bubble Domain Path | Two alternate paths-current in D prohibits propagation in upper path. | Single upper path. |
| Switch Action | Normally closed (by fabricaton personalization) Open if current I present | Always closed. |

Thus, decoders for bubble domains of the type known in the prior art utilize current controlled switches (current loops shaped by lithography and unalterable) for selective propagation of domains in various parts of a magnetic medium in which they exist.

FIG. 3

FIG. 3 shows a decoder in accordance with the present invention. The schematic diagram of the present decoder is similar to that of FIG. 1, and its operation is analogous to that shown in FIG. 1. However, it has the feature of being rewritable, in distinction from prior-art decoders. That is, the various switches used in the decoder of FIG. 3 can have the preferred path for bubble domain movement therethrough switched between two stable states, without requiring additional circuitry or additional operational steps. Moreover, by repositioning control bubbles, new addresses can be chosen for each of the propagation paths in accordance with the system requirements. Thus, these switches and the concept of rewritability can be used with various circuits, such as two-dimensional shift registers.

In more detail, four propagation paths X1, X2, X3, and X4 are shown. Bubble domains appearing at the input of each of these paths will propagate to the output of each path if the proper combination of decode currents A, B, $\overline{A}$, and $\overline{B}$ are present on the decode conductors D1–D4. If the domains at the input of a propagation path are not to get to the output of that path, the domains are rerouted and sent to annihilators AN which are provided for each propagation path. For instance, annihilator AN1 is provided for propagation path X1, while annihilator AN3 is provided for propagation path X3. Of course, the domains which are not sent to the output of any propagation path can be used in other circuits, rather than being annihilated.

As in the schematic diagram of FIG. 1, various switches are located along each propagation path for determining the direction of domains moving along that path. For instance, path X1 has switches S1-A, S1-B, S1-$\overline{A}$, and S1-$\overline{B}$. Switches S1-A and S1-B are designated differently than switches S1-$\overline{A}$ and S1-$\overline{B}$. These switches have similar construction but their operation is different depending upon the control currents applied to them. This will be explained in more detail with respect to FIGS. 4A and 4B.

Figure 4A:
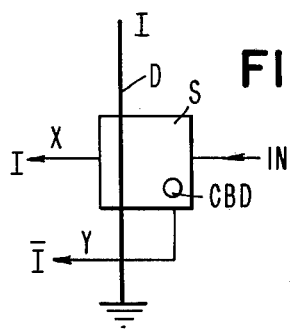
FIGS. 4A and 4B illustrate the operation of the two types of switches used in the decoder of FIG. 3.

FIG. 4A shows a switch S having a decode current line D for control. Bubble domains appearing at the input of this switch exit along either path X or path Y depending upon the presence and absence of current I in line D. For this switch, if no current is present in line D, bubble domains exit along path Y while if current I is present in line D, bubble domains exit switch S along path X.

Figure 4B:
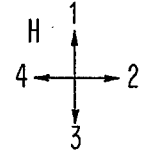
Figure 4B:
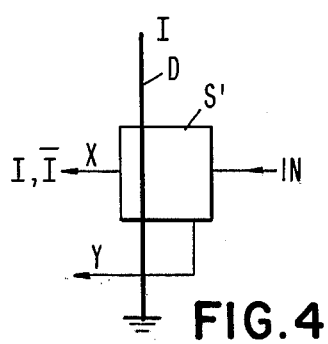

FIG. 4B shows a junction S' which always passes propagation bubbles straight through.

In the switch of FIG. 4A, a black circle is shown representing the presence of a control bubble domain (CBD) in the switch. The presence of this control domain influences the preferred direction of movement through the switch. Examination of FIGS. 4A and 4B reveals that the preferred direction for bubble domain movement in the absence of a current I in decode line D is different for switches S and S'. This is because the control bubble domain is present in switch S while it is not present in switch S'. As will be seen from FIG. 5, the physical structures of switches S and S' are identical, except that the control bubble domain can be selectively placed in the switches to change the state of the switch. Further, it will be seen that a single level metallurgy process may possibly be used to provide both types of switches, there being common means for placing the control bubble domain in the switches and for operating the switches to provide desired output paths for bubble domains therein. Consequently, a rewritable circuit is obtained which is distinguishable over the prior art, and which further may have the advantage of being obtainable with a single level metallurgy.

Structures S (FIG. 4A) and S' (FIG. 4B) may be compared as follows:

|  | FIG. 4A | FIG. 4B |
|---|---|---|
| Control bubble loading | Universal personalization with control bubble<br>Control permalloy disk to each junction (FIG. 5) | Control permalloy disk for each junction (FIG. 5)<br>No control bubble, hence no switch action |
| Conductor | No personalization due to conductor, which is straight through in all junctions. Current in conductor always helps bubble propagation in upper path. | No personalization due to conductor, which is always straight through all junctions. Current aids propagation in upper path. |
| Bubble path | Two alternate paths. | One path. |
| Switch action | Normally open (control bubble) Closed by current in conductor. | Always closed. |

Figure 5:
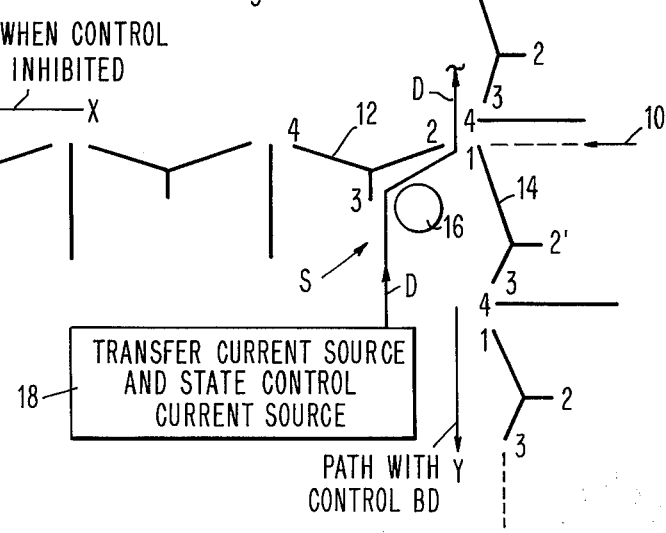
FIG. 5 is a circuit diagram of structure which can be utilized to provide the switches of FIGS. 4A and 4B.

FIG. 5 shows a detailed diagram of a switch which can be operated to provide the functions of switch S and switch S' of FIG. 4A and FIG. 4B, respectively.

In more detail, bubble domains at the input of the switch propagate in the direction of arrow 10 toward the switch, generally designated S. There are two output paths from the switch, each of which is designated by an arrow. The arrow going to the left (X direction) indicates the direction of bubble domain propagation through the switch when no control bubble domain is present and when a control bubble within the switch is inhibited from interacting with bubbles coming into the switch. The arrow pointed downwardly (Y direction) indicates the path taken by a bubble domain when it encounters an interaction with a control bubble domain in the switch.

The switch is broadly comprised of the Y bar element 12, the modified Y bar element 14, the bubble domain holding element (disk) 16, and the current carrying conductor D which is connected to a transfer current source and state control current source 18.

The operation of this switch will now be explained. Bubbles entering switch S along the direction indicated by arrow 10 are made to exit to the left (X direction) or downwardly (Y direction), depending upon whether or not a control bubble domain is present on the disk 16 and whether or not a current is present in conductor D.

Assume that a bubble domain is located on position 1 of Y bar 14. In the absence of a bubble domain on disk 16, this bubble domain will move to pole position 2 on Y bar 12 when in-plane magnetic drive field H moves into direction 2. The bubble domain will not move to position 2' on modified Y-bar 14, since pole 2' is sufficiently far away from pole 1 on Y-bar 14 that it is less attractive than position 2 on element 12. As field H continues to reorient, the bubble domain will move to the left in the X direction.

A subsequent bubble domain entering switch S will move from pole position 1 on element 14 to pole position 2 on element 12 as described previously. As field H changes to orientation 3, this domain will be positioned on pole position 3 of element 12. At this time, a transfer current on conductor D will create a magnetic field gradient causing that bubble domain to move to disk 16. Disk 16 can be comprised of a material such as permalloy. Additionally, it can be another means for holding the bubble domain, such as an ion implanted region in the magnetic material in which the bubble domains exist. Typically, the disk has a diameter approximately twice the diameter of the bubble domains. As the magnetic field H reorients, a bubble domain adjacent to disk 16 will travel around the periphery of this disk.

A domain trapped on disk 16 is termed a "control bubble domain" (CBD). This domain serves to define a new direction of preferred movement of subsequent domains through switch S. In this case, subsequent domains at pole position 1 of element 14 do not move to pole position 2 on element 12 due to the repulsion of the control bubble domain on disk 16. Instead, these domains move to pole position 2' on element 14 and then downwardly along the path indicated by the arrow. The CBD also provides a force which aids the bubble domain to move to pole 2'. The disk 16 is placed with respect to Y bars 12 and 14 to achieve this type of operation. Thus, domains entering switch S have a preferred propagation path downwardly when a control bubble domain is on disk 16, and have a preferred path in the X-direction when no domain is present on disk 16.

A switch S having a control bubble domain on disk 16 can have its state changed from that described in the previous paragraph. In this case, the current source 18 produces another current pulse in conductor D which creates a magnetic field that nullifies the repulsive magnetic field exerted by the control bubble domain on disk 16. This means that a domain at position 1 of element 14 will move to position 2 on element 12 even though a control bubble domain is at disk 16. Thus, a preferred path direction through switch S is now changed to the X-direction. In this manner, the presence of a control bubble domain at the disk does not determine a single propagation path but provides a switch in conjunction with the control current, which is rewritable by loading or unloading the disk.

In FIG. 5, a generator 20 is used to provide the control bubble domains which are placed on disk 16. The generator 20 can be under control of an additional circuit for timing the provision of a domain on the disk 16. The control bubbles and the subsequent propagation bubbles may originate from the same generator, or the subsequent bubbles can be data bubbles from other circuitry on the magnetic medium.

The action of the structure shown in FIG. 5 may be summarized by the following table.

|  | Control bubble present | Control bubble absent |
| --- | --- | --- |
| With current in D | Bubbles follow upper path (switch closed) | Bubbles follow upper path (switch closed) |
| Without current in D | Bubbles follow lower path (switch open) | Bubbles follow upper path (switch closed) |

In contrast with the prior art path selection devices, the structure of FIG. 5 is a true switch which exhibits rewritable switching action between a plurality of states.

FIGS. 6, 6A, 6B

Figure 6A:
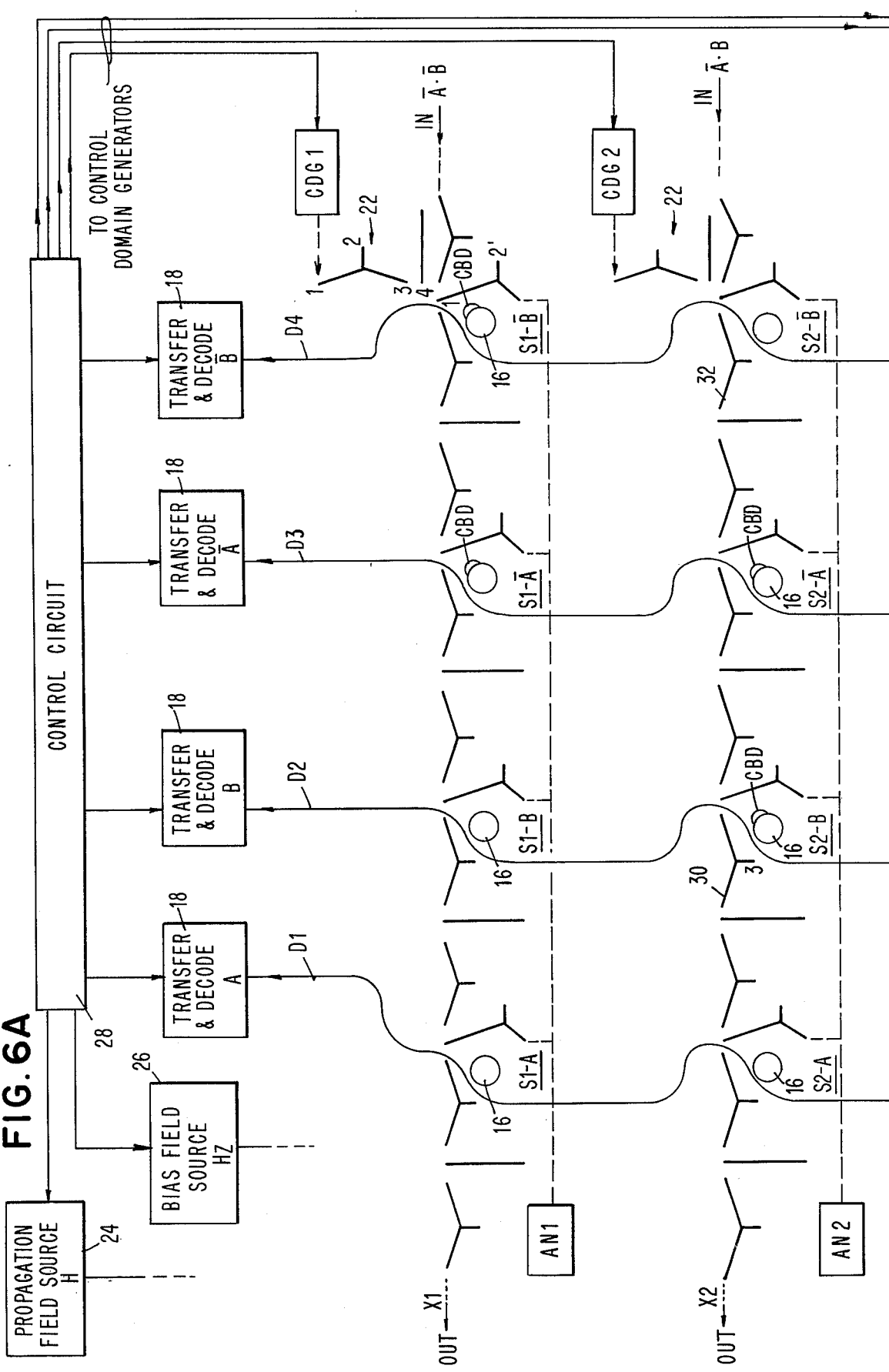

FIG. 6 shows how FIGS. 6A and 6B fit together. FIGS. 6A and 6B show a complete circuit diagram for a decoder having four propagation paths X1, X2, X3, and X4. This structure provides the function described and illustrated with respect to FIG. 3. That is, domains at the input of any of the propagation paths X1 – X4 can be selectively passed to the outputs of these propagation paths when the correct combination of decode currents is present on the decode lines D1, D2, D3, and D4. These currents are designated A, B, $\overline{A}$, and $\overline{B}$, respectively.

The switches S1-A, S1-B, . . . S4-$\overline{B}$ are the same as the switch shown and described in FIG. 5. Where a control bubble domain CBD is present on any disk 16, it is so indicated. For instance, switches S1-$\overline{A}$ and S1-$\overline{B}$ have control bubble domains thereon. It is interesting to note that the sites of personalization for the rewritable decoder complement those for the conventional decoders.

A control domain generator, designated CDG is located adjacent to each propagation path. For instance, CDG2 is the control domain generator for the switches located along path X2. These generators provide the control bubble domains which can be placed on the disk 16 of the switches along the associated propagation path. Another propagation path, generally designated 22, is used to move control bubble domains from each of the control domain generators to the associated propagation paths X1–X4.

A transfer and decode current source 18 is associated with each decode conductor D1–D4. Also, a propagation field source 24 provides the reorienting propagation field H which is used to move bubble domains along the propagation elements, shown here as Y and I-bars. A bias field source 26 provides a magnetic bias field $H_z$ normal to the plane of the magnetic medium in which the bubble domains exist, in a conventional manner. Field $H_z$ can be used to stabilize the size of the domains.

A control circuit 28 is provided for synchronization of all decode operations and for providing addresses to the various switches in order to select which propagation path is to be used for moving bubble domains from the input of the path to the output of the path. Control circuit 28 provides timing and triggering pulses to all of the transfer and decode current sources 18, and to the control domain generators CDG1 – CDG4. In addition, circuit 28 provides inputs to sources 24 and 26.

As with the schematic representation of FIG. 3, domains which do not get to the outputs of their propagation paths are sent along other paths to annihilators AN1 – AN4. Of course, these domains can be routed to other circuitry rather than to annihilators.

OPERATION OF THE DECODER OF FIGS. 6A, 6B

Operation of this decoder will be explained specifically with reference to one of the propagation paths. It should be remembered that bubble domains propagating in any propagation path will pass through each of the switches in a direction dependent upon the state of the switch. That state will be determined by the presence or absence of a control bubble domain on disk 16, and on the presence and absence of a decode control current on the associated decode line D1–D4.

FIGS. 6A and 6B show the combination of decode currents ($\overline{A} \cdot B$, etc.) which must be present to move domains from the input of any propagation path to the output of that path. For instance, a current $\overline{A}$ in line D3 and a current B in line D2 must be present to provide propagation from the input to the output along path X2. In order to obtain proper switches S2-A, S2-B, S2-$\overline{A}$ and S2-$\overline{B}$, control bubble domains are produced by generator CDG2, in response to a signal from control circuit 28. These domains propagate along path X2 and arrive at poles 3 of Y-bar 30 and Y-bar 32. At this time, transfer currents along conductors D2 and D3 move the control bubble domains to the disks 16. This prepares the switches S2-B and S2-$\overline{A}$ along propagation path X2. Switches S2-A and S2-$\overline{B}$ do not require control bubble domains.

Bubble domains appearing at the input of this propagation path move to the left to the output of the path as the propagation field H reorients in the plane of the magnetic medium. Since no current is present in decode line D4, the preferred path for bubble domains through switch S2-$\overline{B}$ is to the left along path X2. The domains coming to switch S2-$\overline{A}$ would normally be deflected downwardly and then to annihilator AN2, in the absence of a current $\overline{A}$ in line D3. However, a current does exist in this conductor line and the bubble domains pass through switch S2-$\overline{A}$ and move to the left toward the output.

The same situation occurs for movement of the domains through switch S2-B. The presence of a current B in line D2 causes the domains to continue to move to the left toward the output, rather than being sent to AN2.

Propagation of the domains through switch S2-A is the same as that through switch S2-$\overline{B}$. That is, no current is present in line D1 and therefore the domains continue to propagate to the output of this path X2.

Operation of the other propagation paths is identical to that described. As can be seen by reviewing movement of domains through all paths other than X2 while currents $\bar{A}$, B are present, it will be verified that domains in all other paths propagate to the respective annihilators, rather than moving to the outputs of these propagation paths.

If it is desired to change the addresses for the various propagation paths or circuitry associated with this decoder, rewritable addresses can be provided by merely collapsing all control bubble domains in the decoder (for instance, by using bias field source 26) and placing control bubble domains on different switches by the same procedure previously outlined with respect to the control bubble domains. Additionally, the decode currents used to inhibit the action of control bubble domains can be changed in order to send bubble domains in different directions through the switches. Thus, considerable flexibility is achieved with the same hardware as is used to propagate the domains and to transfer domains to the disks 16. This means that a single level metallurgy may be achieved to provide a decoder which is rewritable.

Various alternatives can be foreseen by those having skill in the art. For instance, any number of propagation paths can be provided and it is possible to utilize any types of propagation elements.

What is claimed is:

1. A rewritable bubble domain decoder for moving magnetic bubble domains in selected propagation paths in a magnetic medium, comprising:
    propagation means defining a plurality of said propagation paths for said bubble domains,
    rewritable switch means located adjacent to said propagation means for determining the path of said bubble domains in said magnetic medium, said switch exhibiting two stable states each of which is characterized by a different preferred propagation path,
    control means for changing the state of said switch and further means for overriding one of said preferred paths when said switch is maintained in the state corresponding to said one preferred path.

2. The decoder of claim 1, where said switch is comprised of:
    propagation means defining two propagation paths for said bubble domains,
    means for holding a control bubble domain at a position adjacent to said two propagation paths, said control bubble domain interacting with subsequent bubble domains entering said switch when it is at said position,
    means for minimizing said interaction between said control bubble domain and said subsequent bubble domains, said control bubble domain remaining substantially in said position of interaction with said subsequent bubble domains when said interaction is minimized.

3. The decoder of claim 2, where said means for holding said control bubble domain is comprised of a magnetic circuit.

4. The decoder of claim 3, where said means for minimizing is comprised of a current carrying conductor.

5. The decoder of claim 1, where said propagation means is comprised of magnetically soft elements on said magnetic medium and said switches are comprised of magnetically soft elements and current carrying conductors.

6. A bubble domain structure for selectively moving magnetic bubble domains in a magnetic medium, comprising:
    propagation means for moving magnetic bubble domains in a plurality of propagation paths in said magnetic medium,
    switch means located along said propagation paths for determining which propagation paths are taken by said magnetic bubble domains, each said switch means being comprised of:
        means for holding a control bubble domain at a specified location in said magnetic medium,
        means for bringing other magnetic bubble domains sufficiently close to said control bubble domain that interaction can occur therebetween, said interaction causing said other bubble domains to move in a first direction,
        means for moving said other bubble domains in a second direction in said magnetic medium when said other bubble domains are in interactive proximity to said control bubble domain, and
        means for retaining said control bubble domain at said specified location when said interaction is overcome and after said other bubble domains move in said second direction.

7. A magnetic bubble domain switch characterized by first and second stable states, bubble domains being sent along a first output path from said switch when said switch is in its first state and bubble domains being sent along a second output path when said switch is in its second state, comprising:
    means for holding a control bubble domain at a specified location when said switch is in its first stable state, said first output path being determined by interactions between bubble domains entering said switch and said control bubble domain, said switch being characterized by the absence of said control bubble domain at said specified location when said switch is in its second stable state,
    means for maintaining said switch in said first stable state having said control bubble domain at said specified location, and
    means for overcoming the interactions between said control bubble domain and said domains entering said switch while said switch is maintained in said first stable state, and further means for sending said bubble domains along output paths different than said first output path while said control bubble domain is maintained at said specified location.

8. A switch for magnetic bubble domains in a magnetic medium comprising:
    means for holding a control bubble domain,
    means for bringing other bubble domains into interactive proximity to said control bubble domain,
    propagation means for moving said other bubble domains in a first direction after interaction with said control bubble domain, said first direction being determined by said interaction with said control bubble domain,
    propagation means for moving said other bubble domains in a second direction, said other bubble domains not normally moving in said second direction after interaction with said control bubble domain,
    control means for overcoming said interaction and means for moving said domains in said second direction when said other domains and said control domain are in interactive proximity to each other and said control bubble domain remains held by said means for holding.

9. The switch of claim 8, where said means for holding said control bubble domain includes means for producing a magnetic field for confining said control bubble domain in a limited region of said magnetic medium.

10. The switch of claim 9, where said control means includes means for producing a magnetic field substantially opposed in direction to the stray magnetic field of said control bubble domain.

11. A bubble domain switch, comprising:
means for holding a control bubble domain at a specified location in a magnetic medium,
means for moving said control bubble domain from said specified location to change the state of said switch,
means for bringing other bubble domains sufficiently close to said control bubble domain that interaction therebetween can occur, said interaction causing said other bubble domains to move in a first direction,
means for overcoming said interaction when said other bubble domain and said control bubble domain are in interactive proximity to one another to allow said other bubble domains to move in a second direction while said control bubble domain remains at said specified location.

12. The switch of claim 11, including means for placing said control bubble domain at said specified location in said magnetic medium.

13. The switch of claim 11, where said means for overcoming includes means for producing a magnetic field substantially opposed to the stray magnetic field of said control bubble domain.

14. The switch of claim 11, where said means for overcoming is a current carrying conductor.

* * * * *

UNITED STATES PATENT OFFICE
CERTIFICATE OF CORRECTION

Patent No. 4,028,672            Dated June 7, 1977

Inventor(s) Hsu Chang

It is certified that error appears in the above-identified patent and that said Letters Patent are hereby corrected as shown below:

On the title page in the abstract, line 19, "articular" should read -- particular --.

Column 1, line 33, "is" should read -- are --.

Column 3, line 48, "decoder" should read -- decode --.

Column 4, line 7, "domain" should read -- domains --.

Signed and Sealed this

Eleventh Day of October 1977

[SEAL]

Attest:

RUTH C. MASON  
*Attesting Officer*

LUTRELLE F. PARKER  
*Acting Commissioner of Patents and Trademarks*